United States Patent [19]

Pascucci et al.

[11] Patent Number: 5,717,642
[45] Date of Patent: Feb. 10, 1998

[54] LOAD SIGNAL GENERATING METHOD AND CIRCUIT FOR NONVOLATILE MEMORIES

[75] Inventors: Luigi Pascucci; Carla Maria Golla, both of Sesto San Giovanni, Italy

[73] Assignee: SGS-Thomson Microelectronics S.r.l., Agrate Brianza, Italy

[21] Appl. No.: 803,915

[22] Filed: Feb. 25, 1997

Related U.S. Application Data

[63] Continuation of Ser. No. 391,146, Feb. 21, 1995, abandoned.

[30] Foreign Application Priority Data

Feb. 18, 1994 [EP] European Pat. Off. ............. 94830071

[51] Int. Cl.⁶ .................................................. G11C 7/00
[52] U.S. Cl. ...................... 365/191; 365/194; 365/196; 365/205; 365/233
[58] Field of Search ......................... 365/191, 194, 365/196, 205, 233

[56] References Cited

U.S. PATENT DOCUMENTS

| | | |
|---|---|---|
| 5,047,984 | 9/1991 | Monden ........................ 365/191 X |
| 5,228,003 | 7/1993 | Tokuda ........................ 365/191 X |
| 5,414,672 | 5/1995 | Ozeki et al. ................. 365/191 X |
| 5,444,667 | 8/1995 | Obara ......................... 365/191 X |
| 5,515,332 | 5/1996 | Pascucci et al. .............. 365/233 |
| 5,532,972 | 7/1996 | Pascucci et al. .............. 365/233 |
| 5,541,884 | 7/1996 | Pascucci et al. .............. 365/206 |
| 5,559,449 | 9/1996 | Padoan et al. ................ 326/40 |

FOREIGN PATENT DOCUMENTS 0 470 719  2/1992  European Pat. Off. .

OTHER PUBLICATIONS

"Reduced Power for High Performance Memory," *IBM Techincal Disclosure Bulletin* 32(6B):415–416, Nov. 1989.

*Primary Examiner*—Do Hyun Yoo
*Attorney, Agent, or Firm*—David V. Carlson; Seed and Berry LLP

[57] ABSTRACT

A circuit for generating data load pulses of variable length as required includes a source for supplying a short load signal, and a delay element for generating longer pulses as of the short load signal. A static operating mode is provided wherein a load pulse is generated and maintained throughout static operation or as long as critical conditions (standby state, low voltage) persist. An extended pulse is always generated on exiting static operating mode; and the delay element may be disabled by a command when extended timing is not required.

19 Claims, 4 Drawing Sheets

LOAD SIGNAL GENERATING METHOD AND CIRCUIT FOR NONVOLATILE MEMORIES

This is continuation of Ser. No. 08/391,146, filed on Feb. 21, 1995, which is now abandoned.

CROSS REFERENCE TO RELATED APPLICATIONS

The present application claims priority from European Patent Application No 94830071.0, filed Feb. 18, 1994, and incorporated herein by reference. The present application is related to pending U.S. patent application entitled "METHOD AND CIRCUIT FOR TIMING THE LOADING OF NONVOLATILE-MEMORY OUTPUT DATA", by Luigi Pascucci, Marco Maccarrone and Marco Olivo, Application Ser. No. 08/391,160, and filed on Feb. 21, 1995, now U.S. Pat. No. 5,515,332, which claims priority from European Patent Application No. 94830069.4, filed on Feb. 18, 1994; U.S. patent application entitled "INTERNAL TIMING METHOD AND CIRCUIT FOR PROGRAMMABLE MEMORIES", by Luigi Pascucci, Marco Olivo and Carla Maria Golla, application Ser. No. 08/391,159, and filed on Feb. 21, 1995, which claims priority from European Patent Application No. 94830070.2, filed on Feb. 18, 1994; U.S. patent application entitled "PROGRAMMABLE LOGIC ARRAY STRUCTURE FOR SEMICONDUCTOR NONVOLATILE MEMORIES, PARTICULARLY FLASH-EEPROMs", by Silvia Padoan and Luigi Pascucci, and filed application Ser. No. 08/391,149 Feb. 21, 1995, now U.S. Pat. No. 5,559,449, which claims priority from European Patent Application No. 94830072.8, filed on Feb. 18, 1994; U.S. patent application entitled "METHOD AND CIRCUIT FOR SUPPRESSING DATA LOADING NOISE IN NONVOLATILE MEMORIES", by Luigi Pascucci, Carla Maria Golla and Marco Maccarrone, and filed application Ser. No. 08/391,147, on Feb. 21, 1995, now U.S. Pat. No. 5,541,884, which claims priority from European Patent Application No. 94830073.6, filed on Feb. 18, 1994; U.S. patent application entitled "METHOD AND CIRCUIT FOR TIMING THE READING OF NONVOLATILE MEMORIES", by Luigi Pascucci, Silvia Padoan, Carla Maria Golla, Marco Maccarrone and Marco Olivo, and filed application Ser. No. 08,381, 920 on Feb. 21, 1995, now U.S. Pat. No. 5,532,972, which claims priority from European Patent Application No. 94830074.4, filed on Feb. 18, 1994, all of which are incorporated herein by reference.

1. Technical Field

The present invention relates to a load signal generating method and circuit for nonvolatile memories.

2. Background of the Invention

As is known, when dealing with timed memories, single timing is seldom sufficient: for a memory to function reliably, the memory must be free of uncertain conditions (at an intermediate level) which may possibly impair the outcome of a reading which, in the event of a read error, cannot be repeated.

Such uncertain conditions normally occur when the memory is started, due to the slowness with which the various parts are turned on, though such uncertain conditions are not limited to the memory start-up phase. A strong demand now exists for memories with increasingly complex performance features, including the possibility of operating the memory in low-power mode wherein lines vital for operation of the memory are switched to reduce consumption due to power loss. These lines are normally slow in being restored to the correct level following low-power operating mode, and are particularly so in the event the memory has a voltage boost circuit which is invariably slow in responding to enabling of the memory.

As a result, when dealing with memories which are restarted repeatedly during operation, the problem of safely preventing reading errors is particularly felt.

SUMMARY OF THE INVENTION

It is an object of the present invention to provide a method and circuit for preventing reading errors even in the event of slow response of the memory, e.g., when it is restarted. More specifically, the present invention provides for a load signal generating method and circuit for nonvolatile memories.

In practice, according to the present invention, the data load pulse is modulated as best suited to the momentary requirements of the memory. In particular, the duration of the load pulse is extended whenever the memory requires it, and whenever the memory is started or restarted following low-power operating mode. Provision is also made for static operation with a continuous load pulse.

DETAILED DESCRIPTION OF THE INVENTION

Figure 1:
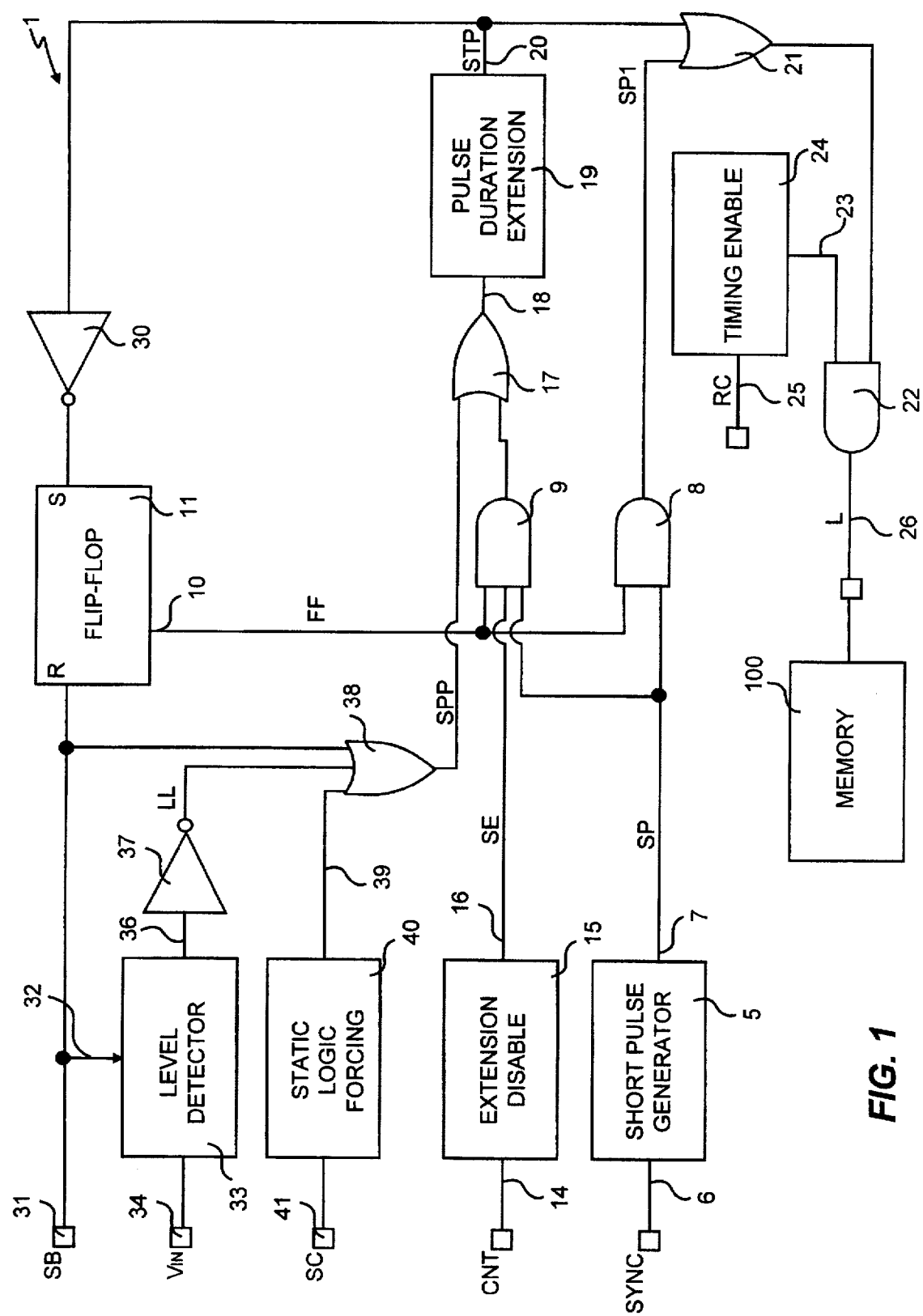
FIG. 1 shows a timing circuit for generating a data load signal in accordance with the present invention.

In FIG. 1, the timing circuit is indicated as a whole by 1, and generates a data load signal L for a memory 100.

Figure 3:
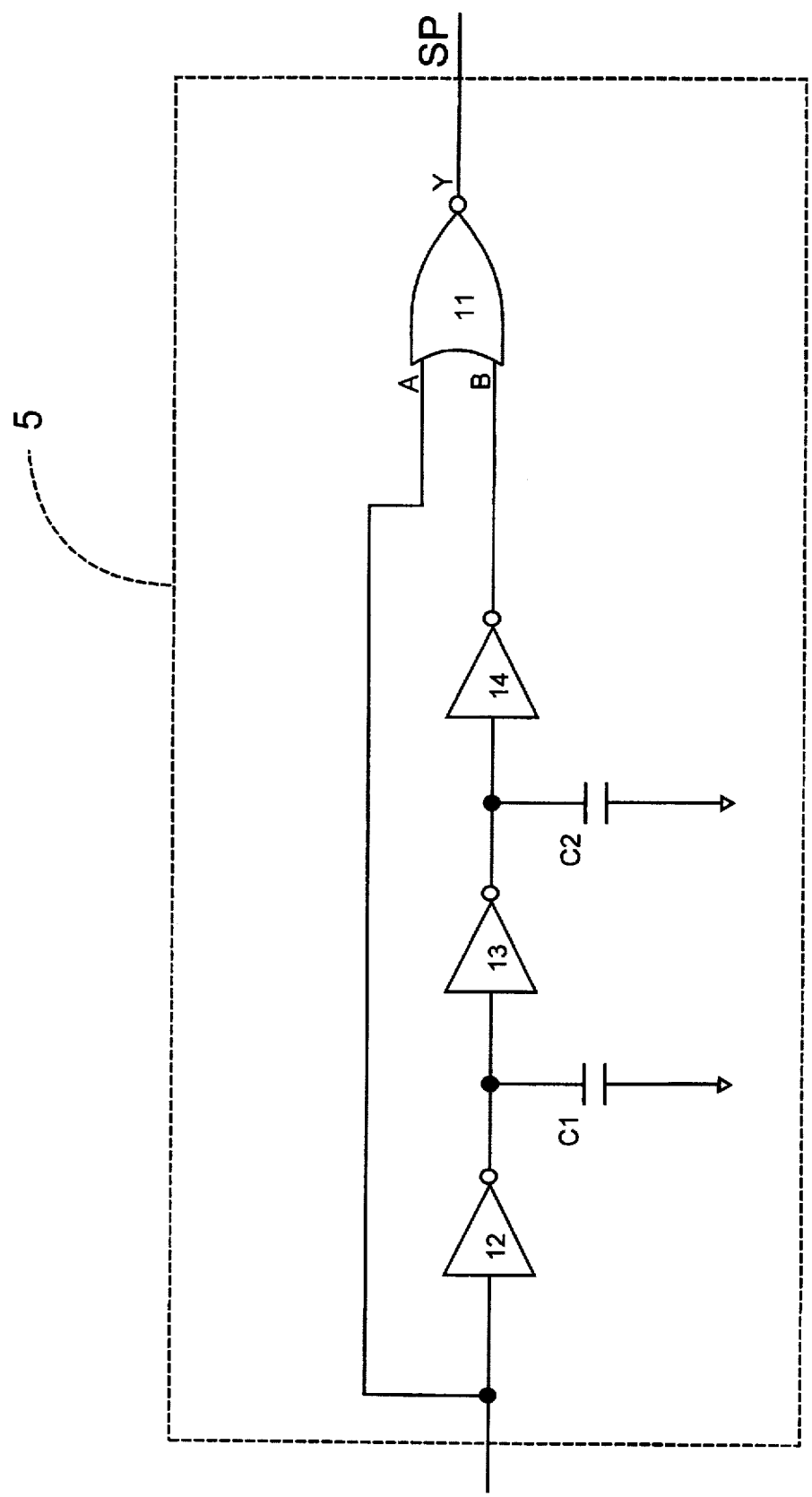
FIG. 3 is a circuit diagram of one possible embodiment of the short pulse generator illustrated in FIG. 1.

Circuit 1 comprises a short pulse generator 5 having an input 6 supplied with a synchronizing signal SYNC, and an output 7 supplying a load pulse signal SP. One possible embodiment for this short pulse generator 5 is shown in FIG. 3. Output 7 is connected to one input of a first two-input AND gate 8, and to one input of a second three-input AND gate 9. The second input of AND gate 8 and a second input of AND gate 9 are connected to the output 10 of a bistable multivibrator or flip-flop 11 having a set input S and a reset input R, and which provides for memorizing the entering and exiting of critical conditions.

The third input of AND gate 9 is connected to the output 16 of an extension enabling and disabling block 15 having an input 14 (supplied with signal CNT) and generating an extension disabling output signal SE as explained later on. The output of AND gate 9 is connected to one input of an OR gate 17, the output of which is connected to the input 18 of a pulse duration extending block 19. Block 19 is composed substantially of a one-switching edge-delay single-shot circuit generating at output 20 an extended pulse signal STP which is high as long as input 18 is high, and which switches to low with a predetermined delay when the signal at input 18 switches to low. One possible circuit structure for block 19 to create such a predetermined delay is disclosed in FIG. 1 of the previously incorporated European Patent Application 94830070.2 (Seed and Berry Docket No. 854063.420).

Figure 4:
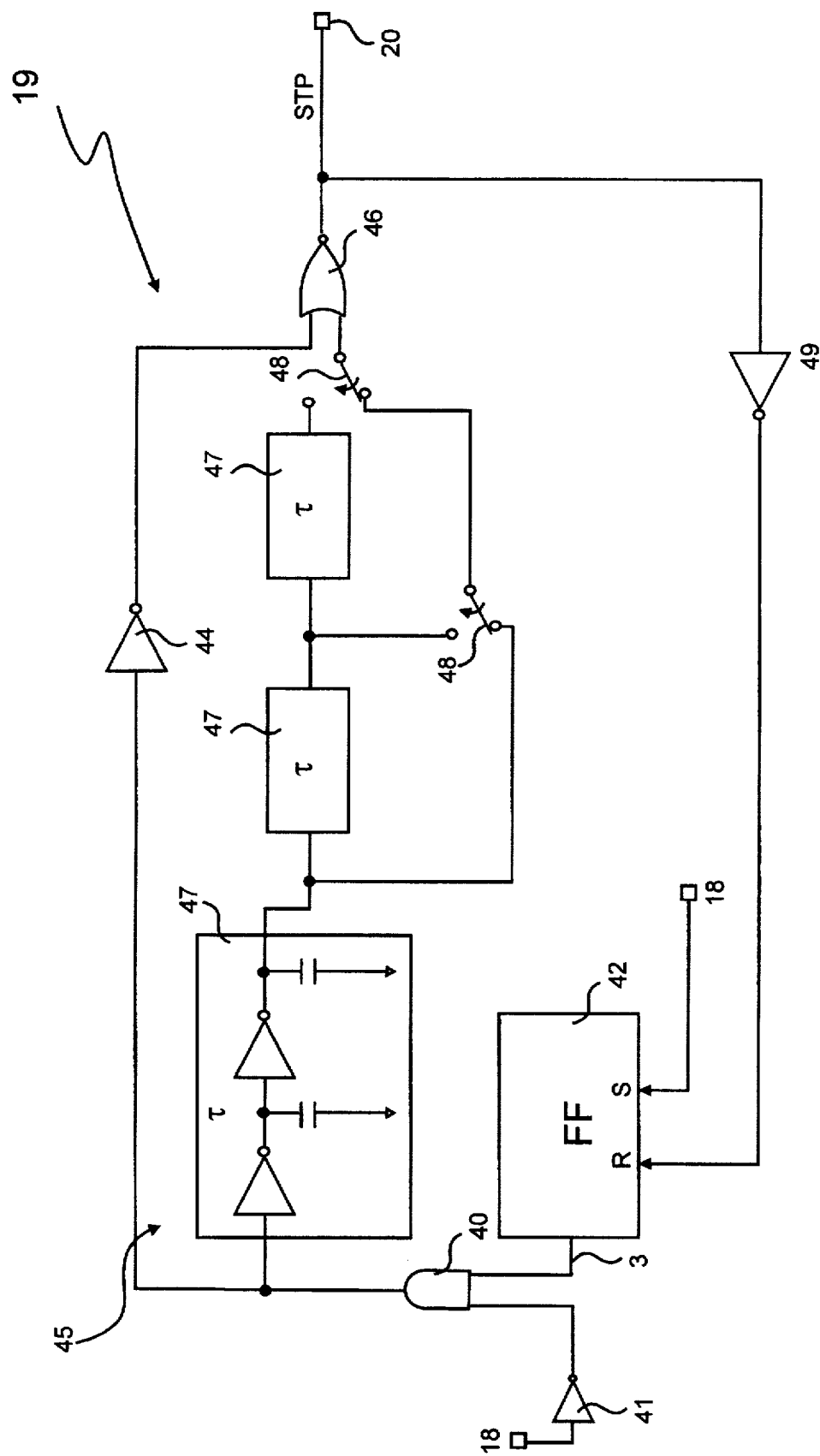
FIG. 4 illustrates another acceptable embodiment of circuit 19.

FIG. 4 illustrates another acceptable embodiment of circuit 19. This embodiment begins the extension of the short pulse received at node 18 by setting flip-flop 42; thus, forcing the output 43 of the flip-flop high. Initially, the output of AND gate 40 remains low by virtue of the low output of inverter 41. At the end of the short pulse, the output of inverter 41 switches to high, thus forcing a high output on AND gate 40. This high output is then coupled to NOR gate 46 via inverter 44; thus, presenting a low input to the NOR gate 46. Simultaneously, this high output is propagated down propagation delay line 45. As is explained in the previously incorporated European Patent Application No. 94830070.2, this propagation delay line is comprised of a number of serially connected elemental delay elements 47. Also as explained in the previously incorporated European Patent Application No. 94830070.2, the length of the pulse extension, or delay, provided by pulse extension block 19 is directly proportional to the number of cascaded elemental delay elements 47 that comprise the propagation delay line 45. In one preferred embodiment, an optimal number of cascaded delay elements is determined during testing and the optimal number is incorporated into the propagation delay line by the appropriate settings of switches 48. Pending the transmittal of the AND's high output signal along the propagation delay line 45, NOR gate 46 receives two low signals at its inputs. Accordingly, signal STP at node 20 is forced to a high state. After delay period τ, NOR gate 46 receives a high input from the propagation delay line; thus forcing signal STP at node 20 to a low state. In this manner, pulse extension block 19 extends the pulse received at its input 18 (received via the short pulse generator 5, AND gate 9, and NOR gate 17 of FIG. 1 ) by a period of τ. As those skilled in the art will appreciate, the delay period τ can be extended, for example to 2τ, 3τ, etc., by selectively configuring switches 48. Once signal STP has been extended for its predetermined time (i.e., delay period τ), inverter 49 resets flip-flop 42 and places pulse extension block 19 in a reset condition (i.e., in a condition to receive the next short pulse).

Output 20 of block 19 and the output of AND gate 8 (supplying pulse signal SP1) are connected to the inputs of an OR gate 21, the output of which is connected to one input of an AND gate 22 having a second input connected to the output 23 of a timing enabling block 24 in turn presenting an input 25 supplied with signal RC. The output 26 of AND gate 22 represents the output of timing circuit 1, at which load signal L is supplied.

Output 20 of block 19 is also connected to input S of flip-flop 11 via an inverter 30. Input R of flip-flop 11 is connected to the input node 31 of circuit 1, which is supplied with a standby signal SB and is also connected to the input 32 of a level detector 33. Level detector 33 is connected to an input node 34 (supplied with controlled voltage $V_{IN}$) and presents an output 36 connected to the input of an inverter 37, the output of which (supplying a low-voltage signal LL) is connected to a first input of a three-input OR gate 38. A second input of OR gate 38 is connected to input node 31, and the third input is connected to the output 39 of a static logic forcing block 40 connected to an input node 41 supplying signal SC. The output of OR gate 38 (supplying static operating control signal SPP) is connected to one input of OR gate 17.

In circuit 1, signals SB, SC, CNT, SYNC, RC and voltage $V_{IN}$ are supplied by memory 100. Level detector 33 compares controlled voltage $V_{IN}$ with a predetermined threshold, and generates at output 36 a logic signal which is high when controlled voltage $V_{IN}$ is above the threshold (so that signal LL is low) and vice versa. For example, in one possible embodiment, level detector 33 is a comparator having a digital output (i.e., "0" or "1") depending whether the input level is higher or lower than the predetermined theshold.

On the basis of the logic level of signal SC, static logic forcing block 40 generates a high output signal for forcing static operation of circuit 1 (e.g., during testing). In one possible embodiment, the static logic forcing block comprises a memory element (e.g., a non-inverting buffer) capable of maintaining the logic level of signal SC.

Extension disabling block 15 provides for preventing extension of the load pulse under particular operating conditions of memory 100, on the basis of the logic level of signal CNT or the settings of memory elements (e.g., fuses) in or external to block 15, and generates a low logic signal for disabling extension of the load pulses. Similar to the static logic forcing block 40, the extension disabling block 15, comprises, in one preferred embodiment, a memory element (e.g., a non-inverting buffer) capable of maintaining the logic level of signal CNT.

Timing enabling block 24 provides for blocking the timing signals when they are not required by memory 100 (in which case, the signal at output 23 and load signal L are low). Again, similar to the static logic forcing block 40 and the extension disabling block 15, the timing enable block 24 comprises, in one preferred embodiment, a memory element (e.g., a non-inverting buffer) capable of maintaining the logic level of signal RC.

Figure 2:
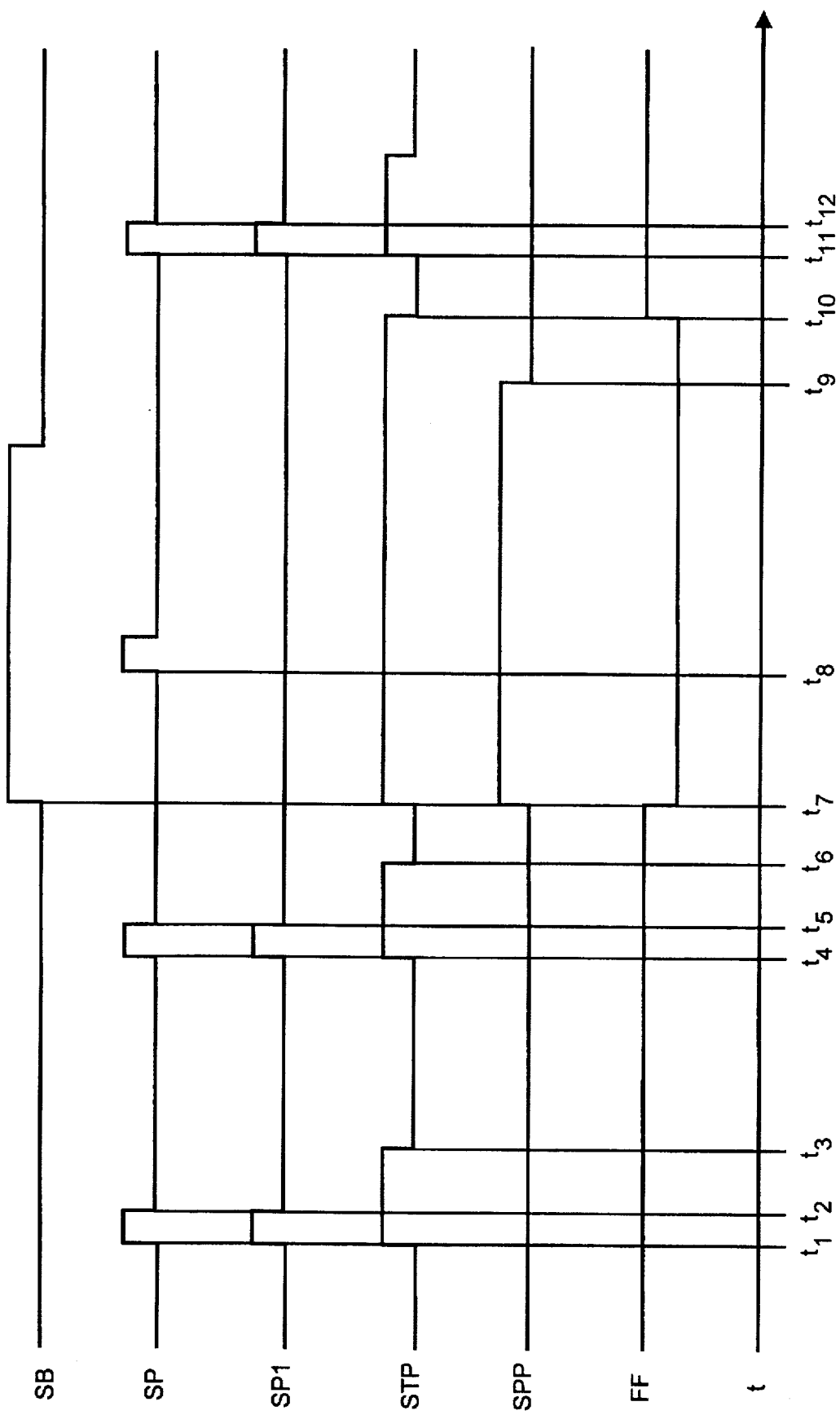
FIG. 2 shows a plot of a number of signals in the FIG. 1 circuit.

Operation of circuit 1 will now be described with reference to FIG. 2 which shows the logic levels of the main signals in various operating conditions.

In steady-state operating mode, and if static operation is not enabled, standby signal SB is low; the output of the level detector is high (so that the output of inverter 37 is low); the signal at output 39 of block 40 is low; signal SE is high; and output signal FF of flip-flop 11 is high. In this condition, on receiving the SYNC signal, short pulse source 5 generates a pulse of predetermined (short) duration, with a leading edge at instant $t_1$ and a trailing edge at instant $t_2$ (signal SP).

Similarly, signal SP 1 presents a pulse of the same duration. The pulse of signal SP is also supplied to the input of duration extending block 19, the output signal STP of which immediately switches to high where it remains as long as signal SP is high. Signal STP also remains high when signal SP switches to low for a given period of time, after which block 19 also switches to low (instant 13). The signal at the output of OR gate 21 thus presents an extended pulse equal to that of signal STP.

The above performance is repeated as long as signal SPP remains low (instants $t_4$–$t_6$). Supposing, now, memory 100 switches to standby at instant $t_7$. In this case, signal SB switches to high, thus resetting flip-flop 11 (output signal FF switches to low and SPP to high) and enabling static operating mode.

As a result, signal STP switches to and remains high; AND gates 8 and 9 prevent the passage of any signal pulses SP (as shown, for example, at instant $t_8$); the output of level detector 33 also switches to low due to the fall in controlled voltage $V_{IN}$; and signal LL switches to high, so that signal L at output 26 presents a continuous high level.

The above condition persists as long as signal SB remains high. Upon SB switching to low, however, the circuit does not switch, due to LL remaining high. As soon as the external device becomes operative (i.e., voltage $V_{IN}$ again exceeds the predetermined threshold value), the output of detector 33 switches to high and LL (and the outputs of circuits 38, 17) to low; signal SPP switches to low, generating a trailing edge in the signal at input 18 (instant 19); after the predetermined delay, signal STP at the output of extending block 19 also switches (instant $t_{10}$) and, inverted by inverter 30, again sets flip-flop 11; signal L at output 26 also switches to low; gates 8, 9 are again enabled, thus terminating static operation; and the next pulse of signal SP (instant $t_{11}$) is supplied to block 19 by which it is extended as described above.

The same static operation is enabled when requested, via signal SC at input 41, by memory 100 or other elements for special functions (such as testing or displaying data from registers or other parts of the memory) and in the event, for any reason, of a fall in voltage which may impair reading accuracy (critical memory operating condition). Conversely, when not required, pulse extension may be disabled in steady-state (i.e., non-critical) mode, in which case, the level of signal CNT at input 14 is such as to switch signal SE to low and so prevent signal SP from being transmitted to block 19.

The advantages of the circuit described are legion. For example, the circuit provides for adapting pulse duration to the conditions of the memory, by generating a short read pulse when conditions are such as to ensure correct reading in a short space of time, thus speeding up operation and reducing the risk of the data being damaged, and by generating extended load pulses when the memory requires a longer read time, e.g., for stabilizing important line voltage levels, and when premature reading may result in read errors. As such, the circuit elements involved in the reading (e.g., the sense amplifiers) are allowed sufficient time to reach the correct voltage level corresponding to the read data.

The circuit described always provides for extended timing when exiting standby mode; and reading is always terminated with a certain delay upon the controlled voltage reaching the required nominal level, thus ensuring correct reading. In standby mode, the transmission paths of any short pulses are interrupted, to prevent error; and, even in the event extended timing is not generally required (low EN signal), the pulse is nevertheless extended when exiting critical conditions (standby, low-voltage, static-logic mode).

When required, the circuit according to the present invention provides for generating a static condition signal.

As such, notwithstanding the extremely simple structure of the circuit according to the present invention, it provides for a highly flexible load pulse and a high degree of reliability.

Clearly, changes may be made to the circuit as described and illustrated herein without, however, departing from the scope of the present invention. In particular, the duration of the extended pulse may be predetermined or adjusted to the characteristics and requirements of the memory by providing and supplying a special input in block 19 with an analog or digital signal, the value of which determines the extent by which switching of the output of block 19 is delayed with respect to a given switching edge of the signal at input 18.

The detailed description provided above illustrates preferred embodiments of the present invention. The description will enable those skilled in the art to make various modifications to these embodiments that do not depart from the spirit and the scope of the present invention. Accordingly, the present invention is not limited to the above-described preferred embodiments, but instead contemplates all such modifications that read on the appended claims and equivalents thereof.

We claim:

1. A load signal generating method for nonvolatile memories, comprising the steps of:

generating a short load pulse;

generating a long load pulse from said short load pulse;

selectively picking up said short load pulse or said long load pulse;

detecting a standby signal; and generating a modulated load signal presenting a load enabling pulse dependent of said selected pulse.

2. A load signal generating circuit for nonvolatile memories, the circuit comprising:

source means having a source output and generating at the source output a short load signal with a pulse of a first duration;

duration extending means having an input and an extension output and supplied at the input with said short load signal and generating at the extension output an extended signal with a pulse of a second duration greater than said first duration;

selecting means connected to said source and extension outputs and having a selection output for selectively supplying said short load signal or said extended signal; and a generator of a load signal having a load enable pulse duration dependent of said selectively supplied signal.

3. A circuit as claimed in claim 2 wherein said duration extending means comprises:

a delay block with a control input, for generating a first switching edge of said extended signal upon detection of a predetermined switching edge at said control input, and for generating a second switching edge of said extended signal with a delay with respect to said second switching edge at said control input.

4. A circuit as claimed in claim 3, further comprising:

extension control means connected to said control input of said delay block.

5. A circuit as claimed in claim 4 wherein said extension control means comprises:

controlled switch means interposed between said source output of said source means and said control input, and having at least one first control terminal connected to extension disabling means.

6. A circuit as claimed in claim 5 wherein said controlled switch means comprises a second control terminal connected to reconfigurable memory means having a first input supplied with a reduced operating mode signal, and an output supplying a disabling signal, said memory means generating a first level of said disabling signal on receiving said reduced operating mode signal.

7. A circuit as claimed in claim 6 wherein said memory means comprises a second input connected to an output of said delay block, said memory means generating a second level of said disabling signal upon detection of said second switching edge of said delay block.

8. A circuit as claimed in claim 4 wherein said extension control means comprises static operation enabling means for supplying a signal of a predetermined logic level at said control input.

9. A circuit as claimed in claim 8 wherein said static operation enabling means are connected at an input to means for generating a low-level signal, to means for generating a critical-condition signal, and to means for generating a static operation request signal.

10. A load signal generating circuit for providing a variable length data load pulse to a memory, the circuit comprising:

a short pulse generator having an output that provides a first output signal;

a pulse extension circuit having an output that provides a second output signal, the second output signal being longer in duration than the first output signal;

a first logic gate having a first input, a second input and an output, the first input being coupled to the output of the short pulse generator, the second input being coupled to the output of the pulse extension circuit, and the output being coupled to the memory;

a standby signal;

a flip-flop having a first input, a second input and an output, the first input being coupled to the output of the pulse extension circuit and the second input being coupled to the standby signal; and a second logic gate having a first input, a second input and an output, the first input being coupled to the output of the short pulse generator, the second input being coupled to the output of the flip-flop, and the output being coupled to an input of the pulse extension circuit.

11. The load signal generating circuit of claim 10 wherein the second logic gate further comprises a third input and wherein the load signal generating circuit further comprises:

an extension enable signal that is coupled to the third input of the second logic gate.

12. The load signal generating circuit of claim 10 wherein the output of the second logic gate is coupled to the input of the pulse extension circuit via a third logic gate, the third logic gate having a first input, a second input and an output, the first input being coupled to the output of the second logic gate, the output being coupled to the input of the pulse extension circuit, the load signal generating circuit further comprising:

a static logic forcing signal that is coupled to the second input of the third logic gate.

13. The load signal generating circuit of claim 12 wherein the static logic forcing signal is coupled to the second input of the third logic gate via a fourth logic gate, the fourth logic gate comprising:

a first input that is coupled to the static logic forcing signal;

a second input that is coupled to the standby signal; and an output that is coupled to the second input of the third logic gate.

14. The load signal generating circuit of claim 13 wherein the fourth logic gate further comprises a third input, and wherein the load signal generating circuit further comprises:

a level detection circuit having a controlled voltage input, a predetermined voltage input, and an output, the output being coupled to the third input of the fourth logic gate.

15. The load signal generating circuit of claim 14 wherein the output of the level detection circuit is coupled to the third input of the fourth logic gate via an inverting element.

16. The load signal generating circuit of claim 10 wherein the first input of the flip-flop is coupled to the output of the pulse extension circuit via an inverting element.

17. The load signal generating circuit of claim 10 wherein the first input of the first logic gate is coupled to the output of the short pulse generator via a third logic gate, the third logic gate comprising:

a first input that is coupled to the output of the short pulse generator;

a second input that is coupled to the output of the flip-flop; and an output that is coupled to the first input of the first logic gate.

18. The load signal generating circuit of claim 10 wherein the output of the first logic gate is coupled to the memory via a third logic gate, the third logic gate having a first input, a second input and an output, the first input being coupled to the output of the first logic gate, and the output being coupled to the memory, the load signal generating circuit further comprising:

a timing enable signal that is coupled to the second input of the third logic gate.

19. A load signal generating circuit for nonvolatile memories, the circuit comprising:

source means having a source output and generating at the source output a short load signal with a pulse of a first duration;

duration extending means having an input and an extension output and supplied at the input with said short load signal and generating at the extension output an extended signal with a pulse of a second duration greater than said first duration;

selecting means connected to said source and extension outputs and having a selection output for selectively supplying said short load signal or said extended signal;

extension enabling/disabling means connected to said duration extending means, for generating an enabling signal; and a generator of a load signal having a load enable pulse modulation dependent of said selectively supplied signal.

* * * * *